(12) United States Patent
Shrowthi et al.

(10) Patent No.: US 11,884,536 B2
(45) Date of Patent: Jan. 30, 2024

(54) ELECTRICAL INTERCONNECTION STRUCTURE, ELECTRONIC APPARATUS AND MANUFACTURING METHODS FOR THE SAME

(71) Applicant: AAC Technologies (Nanjing) Co. Ltd., Nanjing (CN)

(72) Inventors: Bharadwaja S.N. Shrowthi, Irvine, CA (US); Jeffrey Crosswell Maling, Grand Isle, VT (US)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 304 days.

(21) Appl. No.: 17/186,011

(22) Filed: Feb. 26, 2021

(65) Prior Publication Data
US 2022/0127138 A1    Apr. 28, 2022

Related U.S. Application Data

(60) Provisional application No. 63/104,535, filed on Oct. 23, 2020.

(51) Int. Cl.
*B81B 7/00* (2006.01)
*B81C 1/00* (2006.01)

(52) U.S. Cl.
CPC ........ *B81B 7/0006* (2013.01); *B81C 1/00301* (2013.01)

(58) Field of Classification Search
CPC ........................... B81B 7/0006; B81C 1/00301
See application file for complete search history.

(56) References Cited

U.S. PATENT DOCUMENTS

| | | | |
|---|---|---|---|
| 9,550,667 B1* | 1/2017 | Chou | B81B 7/02 |
| 10,081,534 B2* | 9/2018 | Maling | H01L 21/02063 |
| 2007/0004096 A1* | 1/2007 | Heuvelman | B81C 1/00301 |
| | | | 257/E23.149 |
| 2007/0224832 A1* | 9/2007 | Zurcher | B81C 1/00253 |
| | | | 438/758 |
| 2010/0001368 A1* | 1/2010 | Charbuillet | B81C 1/00238 |
| | | | 257/E21.573 |
| 2013/0154033 A1* | 6/2013 | Czabaj | B81C 1/0015 |
| | | | 716/110 |

(Continued)

*Primary Examiner* — Benjamin P Sandvik
(74) *Attorney, Agent, or Firm* — W&G Law Group

(57) ABSTRACT

Provided are an electrical interconnection structure, an electronic apparatus and manufacturing methods therefor, which can provide a reliable electrical interconnection structure between the MEMS apparatus and an external circuit while sealing and encapsulating the MEMS device. The electrical interconnection structure includes: a bonding metal; a first dielectric layer and a second dielectric layer. The first dielectric layer includes a first through hole penetrating the first dielectric layer and exposing the bonding metal. The first through hole is filled with a first conductive material electrically connected to the bonding metal. The second dielectric layer includes a second through hole. An orthographic projection of second conductive material in the second through hole covers an orthographic projection of first conductive material in the first through hole onto the plane of the base. The second through hole is filled with a second conductive material electrically connected to the first conductive material.

11 Claims, 9 Drawing Sheets

(56) References Cited

U.S. PATENT DOCUMENTS

2015/0368090 A1\* 12/2015 Brigham ............ B81C 1/00047
  257/415
2018/0319653 A1\* 11/2018 Maling ............. H01L 21/02063
2020/0131028 A1\* 4/2020 Cheng ................... B81B 7/008
2021/0260623 A1\* 8/2021 Qian .................... B06B 1/0662

\* cited by examiner

ELECTRICAL INTERCONNECTION STRUCTURE, ELECTRONIC APPARATUS AND MANUFACTURING METHODS FOR THE SAME

TECHNICAL FIELD

The present invention relates to the technical field of electronic devices, and in particular, to an electrical interconnection structure, an electronic apparatus and manufacturing methods therefor.

BACKGROUND

Micro electro-mechanical systems (MEMS) devices, such as gyroscopes, accelerometers, pressure sensors, gas sensors, etc., have received more and more attention. In order to drive the MEMS device and transmit a signal outputted from the MEMS device, a through hole filled with a conductive material is usually provided in an insulation layer of the MEMS device for achieving an electrical interconnection with a conductive structure. However, there is a great risk in integrating a process for setting the through hole into a process for manufacturing the MEMS device.

SUMMARY

In view of this, embodiments of the present invention provide an electrical interconnection structure, an electronic apparatus and a manufacturing method therefor, aiming to provide a reliable electrical interconnection structure between the MEMS apparatus and an external circuit while sealing and encapsulating MEMS devices.

In an aspect, an embodiment of the present invention provides an electrical interconnection structure, including: a bonding metal; a first dielectric layer located at a side of the bonding metal, wherein the first dielectric layer includes a first through hole penetrating the first dielectric layer, the first through hole exposes the bonding metal, and the first through hole is filled with a first conductive material electrically connected to the bonding metal; and a second dielectric layer located at a side of the first dielectric layer facing away from the bonding metal, wherein the second dielectric layer includes a second through hole, an orthographic projection of a second conductive material filled in the second through hole onto a plane of the bonding metal covers an orthographic projection of the first conductive material filled in the first through hole onto the plane of the bonding metal, and the second conductive material is electrically connected to the first conductive material.

As an improvement, a sum of a height of the first through hole and a height of the second through hole is greater than or equal to 9 μm.

As an improvement, each of the first through hole and the second through hole is a taper-shaped through hole, and an angle formed between a side wall of the taper-shaped through hole and a thickness direction of the electrical interconnection structure is within a range from 0° to 20°.

As an improvement, the first conductive material includes tungsten or copper.

As an improvement, a ratio of a height of the first through hole to a width of the first through hole is within a range from 3:1 to 4:1.

As an improvement, a thickness of the first dielectric layer is 3.5 μm.

As an improvement, a thickness of the second dielectric layer is within a range from 5.7 μm to 5.8 μm.

As an improvement, the second dielectric layer includes a first dielectric sub-layer and a second dielectric sub-layer that are stacked, and the first dielectric sub-layer is located between the second dielectric sub-layer and the first dielectric layer; and a thickness of the first dielectric sub-layer is within a range from 0.2 μm to 0.3 μm As an improvement, a thickness of the second dielectric sub-layer is 5.5 μm.

In another aspect, an embodiment of the present invention provides an electronic apparatus, including: an electronic device and the electrical interconnection structure as described above. The electrical interconnection structure is electrically connected to the electronic device.

As an improvement, the electronic device includes a Micro Electro Mechanical Systems (MEMS) device; the electronic apparatus further includes a base, and the MEMS device is located inside a cavity at a side of the base; and the electrical interconnection structure is located at a side of the cavity facing away from the base.

As an improvement, the second dielectric layer includes a first dielectric sub-layer and a second dielectric sub-layer that are stacked, and the first dielectric sub-layer is located between the second dielectric sub-layer and the first dielectric layer; vent holes penetrating both the first dielectric layer and the first dielectric sub-layer are provided, and an orthographic projection of etchant in each of the vent holes onto a plane of the base does not overlap an orthographic projection of the first conductive material filled in the first through hole onto the plane of the base; and the vent holes are filled with the second dielectric sub-layer.

In still another aspect, an embodiment of the present invention provides a manufacturing method for an electrical interconnection structure, including: forming a bonding metal; forming a first dielectric layer on a side of the bonding metal; forming a first through hole penetrating the first dielectric layer in the first dielectric layer to expose the bonding metal; forming a first conductive material, wherein the first through hole is filled with the first conductive material and the first conductive material is electrically connected to the bonding metal; forming a second dielectric layer on a side of the first dielectric layer facing away from the bonding metal; forming a second through hole penetrating the second dielectric layer in the second dielectric layer, an orthographic projection of a second conductive material filed in the second through hole onto a plane of the bonding metal covering an orthographic projection of the first conductive material filed in the first through hole onto the plane of the bonding metal; and forming a second conductive material, wherein the second conductive material is electrically connected to the first conductive material.

As an improvement, the first conductive material includes tungsten or copper.

As an improvement, the first conductive material includes tungsten, and said forming the first conductive material includes forming the first conductive material by chemical vapor deposed tungsten hexafluoride.

In yet another aspect, an embodiment of the present invention provides a manufacturing method for an electronic apparatus, including: manufacturing an electronic device; and forming the electrical interconnection structure by the method as described above. The electrical interconnection structure is electrically connected to the electronic device.

As an improvement, the electronic device includes a MEMS device, the second dielectric layer includes a first dielectric sub-layer and a second dielectric sub-layer that are stacked, and the first dielectric sub-layer is located between the second dielectric sub-layer and the first dielectric layer.

Said manufacturing the electronic device and said forming the electrical interconnection structure includes: forming a sacrificial layer and the MEMS device on a side of a base; forming a bonding metal on a side of the sacrificial layer facing away from the base; forming a first dielectric layer on a side of the bonding metal facing away from the base; forming a first through hole penetrating the first dielectric layer in the first dielectric layer to expose the bonding metal; forming a first conductive material, the first through hole being filled with the first conductive material; forming a first dielectric sub-layer on a side of the first dielectric layer facing away from the MEMS device; forming vent holes penetrating both the first dielectric sub-layer and the first dielectric layer; removing the sacrificial layer through the vent holes to form a cavity surrounding the MEMS device; forming a second dielectric sub-layer on a side of the first dielectric sub-layer facing away from the base, the vent holes being filled with the second dielectric sub-layer; forming a second through hole penetrating both the first dielectric sub-layer and the second dielectric sub-layer, an orthographic projection of the second conductive material filed in the second through hole onto a plane of the base covering an orthographic projection of the first conductive material filed in the first through hole onto the plane of the base; and forming a second conductive material, wherein the second conductive material is electrically connected to the first conductive material.

As an improvement, the sacrificial layer is removed by using one or more of $XeF_2$, $SF_6$, fluorocarbon, $O_2/O_3$ ashing, or a mixture of HF and $CH_3OH$.

For the electrical interconnection structure, the electronic device and the manufacturing methods therefor provided by the embodiments of the present invention, the first through hole and the second through hole that are stacked are provided, and a height of the first through hole and a height of the second through hole can be adjusted to achieve adjustment of a total height of the through holes, in such a manner that the total height of the through holes satisfies a certain height requirement. For example, the total height of the two through holes can be at least 9 μm, increasing a ratio of a metal area to a thickness of a pull-up electrode. Moreover, on basis of increasing the height of the through holes, the through holes can be filled according to the embodiments of the present invention. When filling the first through hole and/or second through hole, the first conductive material and/or the second conductive material, with which the first through hole and/or the second through hole are filled based on the ratio of the height to the width of the first through hole and/or second through hole, can achieve filling with or without a gap. When a gap is formed in the first conductive material and/or the second conductive material, the gap is buried inside the first conductive material and/or the second conductive material, thereby avoid affecting an electrical interconnection between the electrical interconnection structure and an external redistribution layer. With such configuration, local accumulation of materials, including the first conductive material and the second conductive material, inside the through holes can be avoided. Moreover, with such configuration, the first conductive material and the bonding metal disposed at a lower position can be protected from being etched. In addition, with such configuration, a plurality of first through holes and a plurality of second through holes can be provided. That is, a density of through holes, including the first through hole and the second through hole, can be changed. This can achieve a higher RF performance for the MEMS apparatus, while increasing a yield of the MEMS apparatus.

BRIEF DESCRIPTION OF DRAWINGS

In order to more clearly illustrate technical solutions in embodiments of the present invention, the accompanying drawings used in the embodiments are briefly introduced as follows. It should be noted that the drawings described as follows are merely part of the embodiments of the present invention, other drawings can also be acquired by those skilled in the art without paying creative efforts.

Figure 1:
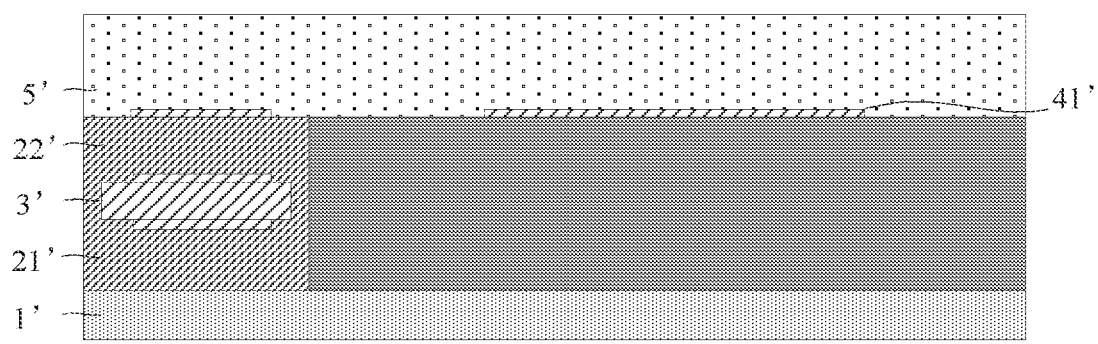
FIG. 1 is a schematic cross-sectional view of a MEMS apparatus during a manufacturing process in the related art.

It should be noted that these accompanying drawings and wording descriptions are not intended to limit a scope of the present invention in any way, but to explain a concept of the present invention to those skilled in the art by referring to specific embodiments.

DESCRIPTION OF EMBODIMENTS

For better illustrating technical solutions of the present invention, embodiments of the present invention will be described in detail as follows with reference to the accompanying drawings.

It should be noted that, the described embodiments are merely exemplary embodiments of the present invention, which shall not be interpreted as providing limitations to the present invention. All other embodiments obtained by those skilled in the art without creative efforts according to the embodiments of the present invention are within the scope of the present invention.

The terms used in the embodiments of the present invention are merely for the purpose of describing particular embodiments but not intended to limit the present invention. Unless otherwise noted in the context, the singular form expressions "a", "an", "the" and "said" used in the embodiments and appended claims of the present invention are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that, the terms such as "upper", "lower", "left", "right" and the like are used to indicate positions shown in the drawing, instead of being construed as limitations of the embodiment of the present invention. In addition, when an element is described as being "on" or "under" another element in the context, it should be understood that the element can be directly or via an intermediate element located "on" or "under" another element.

It should be understood that, although a through hole may be described using the terms of "first", "second", "third", etc., in the embodiments of the present invention, the through hole will not be limited to these terms. These terms are merely used to distinguish through holes from one another. For example, without departing from the scope of the embodiments of the present invention, a first through hole may also be referred to as a second through hole, and similarly, a second through hole may also be referred to as a first through hole, etc.

At present, there are several manners as described in the following for setting a through hole for an electrical interconnection in the MEMS apparatus.

First Manner

FIG. 1 is a schematic cross-sectional view of a MEMS apparatus during a manufacturing process in the related art. With reference to FIG. 1, first, a first sacrificial layer 21', a MEMS device 3' and a second sacrificial layer 22' are sequentially formed on a side of base 1'. Then, a first bonding metal 41' is formed on a side of the second sacrificial layer 22' facing away from the first sacrificial layer 21'. Then, a lid oxide layer 5' is formed on a side of the first bonding metal 41' facing away from the second sacrificial layer 22'.

Figure 2:
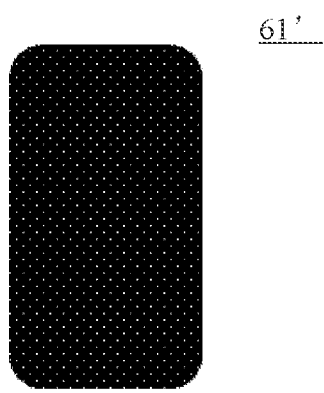
FIG. 2 is a schematic top view of a part of a first mask.
Figure 3:
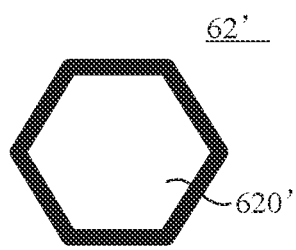
FIG. 3 is a schematic top view of a part of a second mask.

After the lid oxide layer 5' is formed, the lid oxide layer 5' is patterned. In a patterning process, masks as shown in FIG. 2 and FIG. 3 are used. Here, a first mask 61' shown in FIG. 2 includes a plurality of small openings (as shown by white dots in FIG. 2), and a second mask 62' shown in FIG. 3 includes a large opening 620'.

Figure 4:
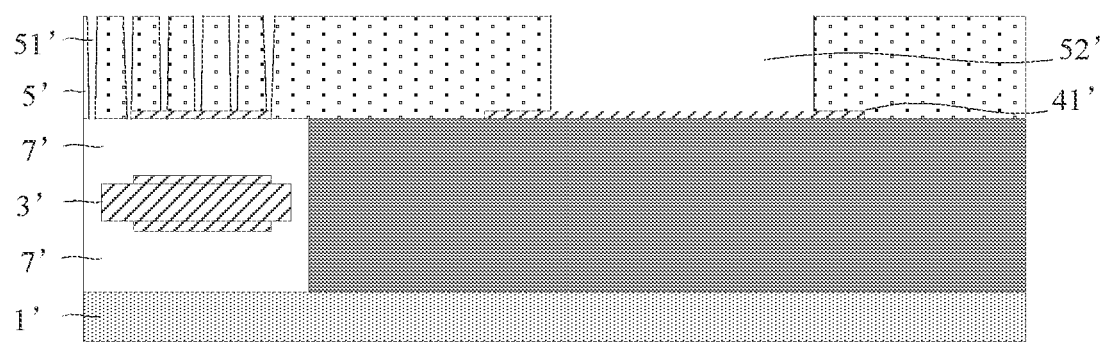
FIG. 4 is another schematic cross-sectional view of a MEMS apparatus during a manufacturing process in the related art.

FIG. 4 is another schematic cross-sectional view of a MEMS apparatus during a manufacturing process in the related art. With reference to FIG. 1 to FIG. 4, after the lid oxide layer 5' is formed, the first mask 61' shown in FIG. 2 is set correspondingly to the first sacrificial layer 21' and the second sacrificial layer 22', and the second mask 62' is set correspondingly to the first bonding metal 41'. Vent holes 51' penetrating through the lid oxide layer 5' are formed in the lid oxide layer 5' by using the small openings of the first mask 61'. The vent holes 51' are used for etching the first sacrificial layer 21' and the second sacrificial layer 22' to form a cavity 7' at positions of the first sacrificial layer 21' and the second sacrificial layer 22' to release the MEMS device 3'. A through hole 52' penetrating the lid oxide layer 5' and exposing the first bonding metal 41' is formed in the lid oxide layer 5' by using the large opening of the second mask 62'.

Figure 5:
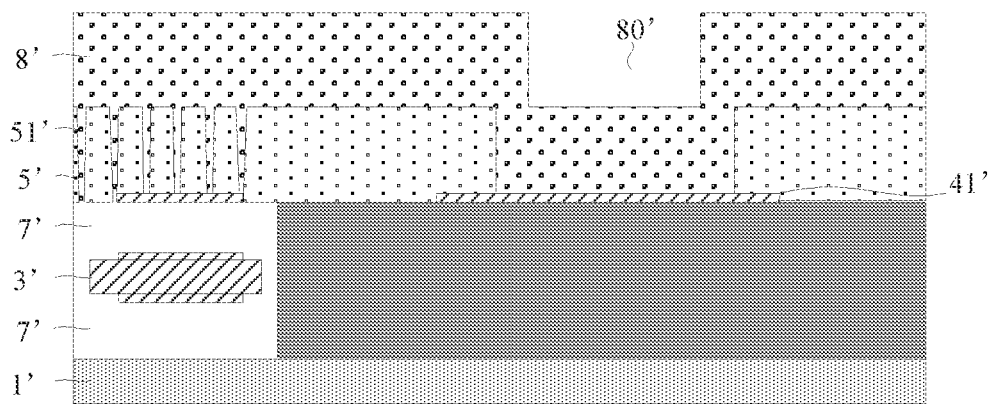
FIG. 5 is still another schematic cross-sectional view of a MEMS apparatus during a manufacturing process in the related art.

FIG. 5 is still another schematic cross-sectional view of a MEMS apparatus during a manufacturing process in the related art. When the cavity 7' is formed after the first sacrificial layer 21' and the second sacrificial layer 22' are removed, a sealing layer 8' is formed on the lid oxide layer 5', as shown in FIG. 5. In an example, the sealing layer 8' may be made of oxide or nitride, to seal the vent holes 51' formed in the lid oxide layer 5'. With reference to FIG. 5, after the sealing layer 8' is formed, the through hole 52' is filled. In an example, forming the sealing layer 8' may adopt a conformal process, that is, after the sealing layer 8' is formed, a surface of the sealing layer 8' will be formed into a shape similar to a surface of the lid oxide layer 5'. With reference to FIG. 5, the sealing layer 8' includes a concave structure 80' at a position corresponding to the through hole 52'.

Figure 6:
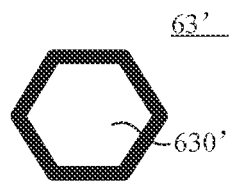
FIG. 6 is a schematic top view of a part of a third mask.
Figure 7:
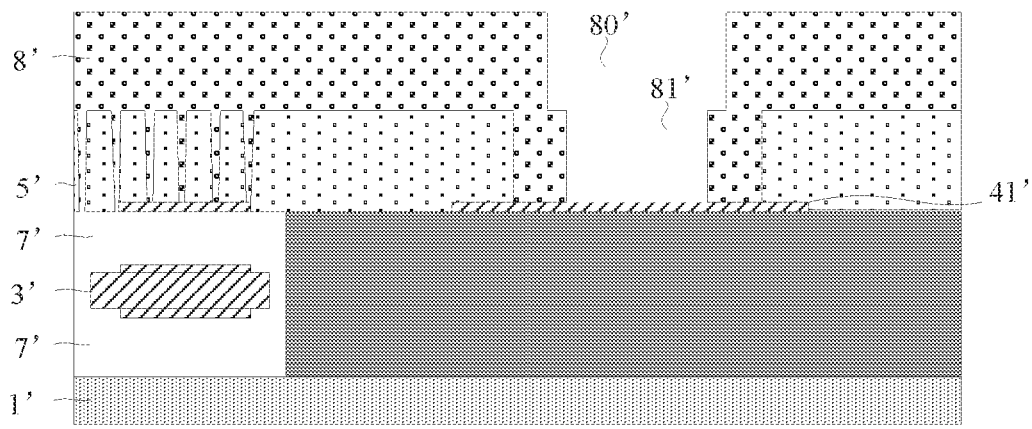
FIG. 7 is still another schematic cross-sectional view of a MEMS apparatus during a manufacturing process in the related art.

After the sealing layer 8' is formed, the sealing layer 8' is patterned by using a third mask 63' shown in FIG. 6 so as to expose the first bonding metal 41'. In an example, an area of the opening 630' of the third mask 63' may be slightly smaller than an area of the opening 620' of the second mask 62', so that an area of the through hole 81' formed in the sealing layer 8' is smaller than a surface area of the cave structure 80'. In this way, a step-shaped through hole is formed in the MEMS apparatus as shown in FIG. 7. In this process, if TiN is provided on a surface of the first bonding metal 41', a TiN removal and etching step may be further provided for removing TiN. If the etching step described above may last for a long enough time, the TiN removal and etching step may be omitted.

Then, the through hole 81' may be filled with a conductive material and then a redistribution layer (RDL) may be formed, so that the first bonding metal 41' is connected to the RDL. Therefore, the MEMS apparatus is connected to an external circuit to drive the MEMS apparatus and transmit a signal outputted from the MEMS apparatus.

In an example, with reference to FIG. 7, the concave structure 80' and the through hole 81' may have side walls that are almost perpendicular to the base.

In an example, the first mask 61' shown in FIG. 2 and the second mask 62' shown in FIG. 3 may be integrated into one piece. When forming the vent holes 51' and the through hole 52' in the lid oxide layer 5', reactive ion etching (RIE) may be adopted. In this case, different RIE hysteresis coefficients may be selected to determine different desired etching depths. For example, a speed for etching a region corresponding to the small vent holes 51' in the lid oxide layer 5' may be lower than a speed for etching a region corresponding to the large through hole 52' in the lid oxide layer 5'. That is, there is a certain hysteresis for etching the region corresponding to the vent holes 51', and there is no hysteresis for etching the region corresponding to the through hole 52', and the etching of the lid oxide layer 5' ends when the through hole 52' is in contact with or close to the first bonding metal 41'.

With this manner, when the lid oxide layer 5' is etched to form the vent holes 51' and the through hole 52', there is a risk of the first bonding metal 41' being overetched.

Second Manner

In this manner, the first sacrificial layer 21', the MEMS device 3', the second sacrificial layer 22', the first bonding metal 41' and the lid oxide layer 5' are formed still with reference to FIG. 1.

Figure 8:
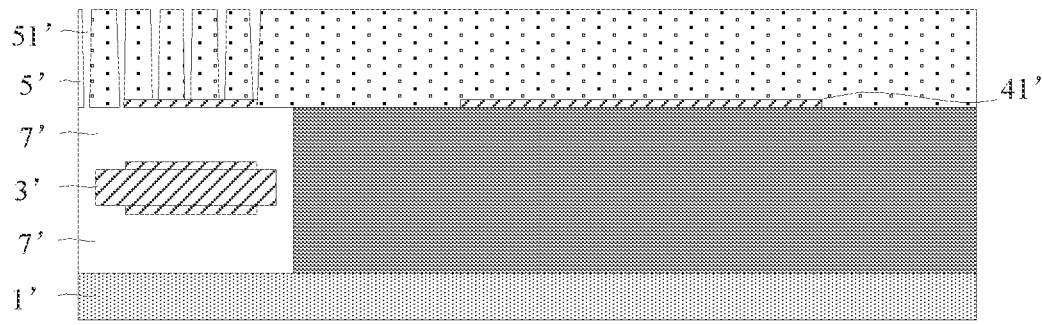
FIG. 8 is still another schematic cross-sectional view of a MEMS apparatus during a manufacturing process in the related art.

FIG. 7 is still another schematic cross-sectional view of a MEMS apparatus during a manufacturing process in the related art, and FIG. 8 is still another schematic cross-sectional view of a MEMS apparatus during a manufacturing process in the related art. After the lid oxide layer 5' is formed, as shown in FIG. 2, FIG. 7 and FIG. 8, the first mask 61' shown in FIG. 2 is set correspondingly to the first sacrificial layer 21' and the second sacrificial layer 22', and vent holes 51' penetrating the lid oxide layer 5' are formed by using the small openings of the first mask 61'. The vent holes 51' are used for etching the first sacrificial layer 21' and the second sacrificial layer 22' to form a cavity 7' at positions of the first sacrificial layer 21' and the second sacrificial layer 22' to release the MEMS device 3'.

Figure 9:
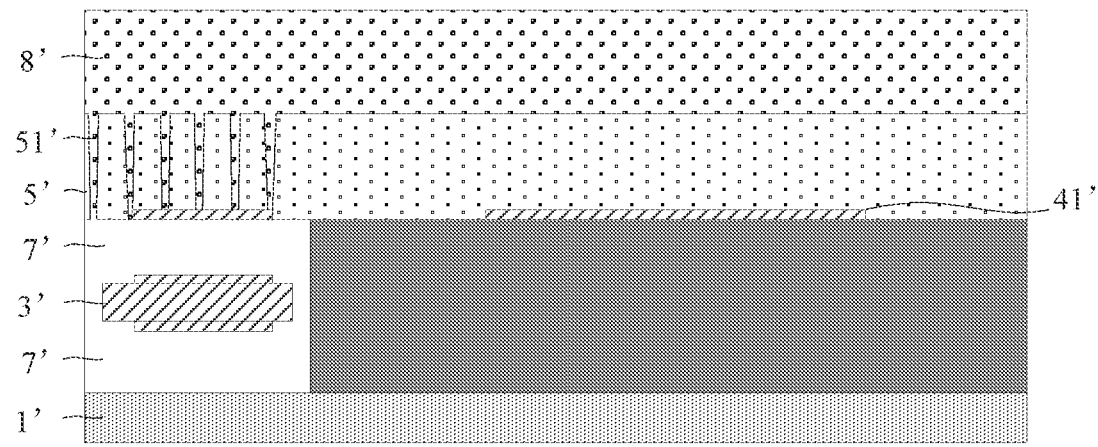
FIG. 9 is still another schematic cross-sectional view of a MEMS apparatus during a manufacturing process in the related art.

FIG. 9 is still another schematic cross-sectional view of a MEMS apparatus during a manufacturing process in the related art. With reference to FIG. 9, when the cavity 7' is formed after the first sacrificial layer 21' and the second sacrificial layer 22' are removed, a sealing layer 8' is formed on the lid oxide layer 5'. In an example, the sealing layer 8' may be made of oxide or nitride to seal the vent hole 51' of the lid oxide layer 5'.

Figure 10:
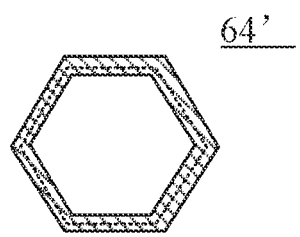
FIG. 10 is a schematic top view of a part of a fourth mask.
Figure 11:
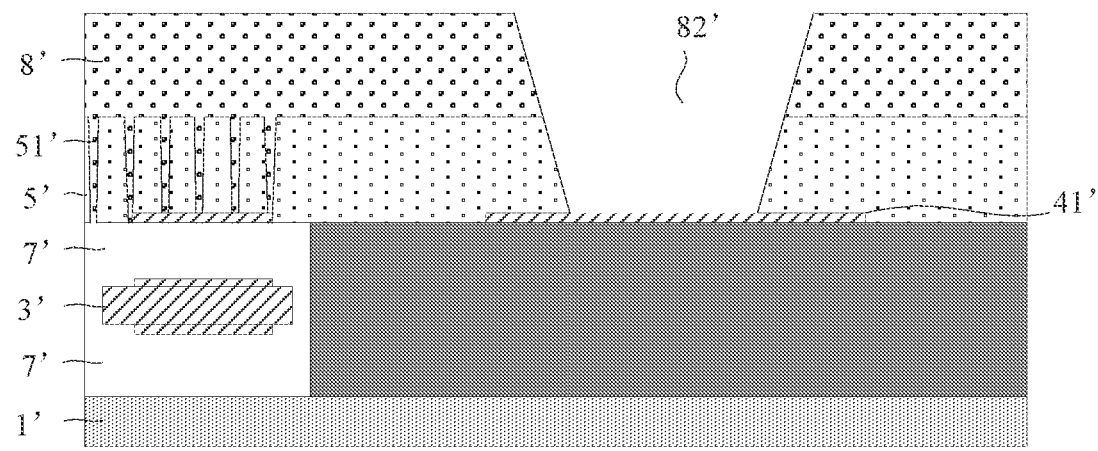
FIG. 11 is still another schematic cross-sectional view of a MEMS apparatus during a manufacturing process in the related art.

After the sealing layer 8' is formed, a fourth mask 64' shown in FIG. 10 is used to pattern the sealing layer 8' and the lid oxide layer 5', so as to form a taper-shaped through hole 82' that penetrates the sealing layer 8' and the lid oxide layer 5' and exposes the first bonding metal 41', as shown in FIG. 11. In an example, the fourth mask 64' is used to pattern a full-dimension bonding metal. An area of an upper portion of the through hole 82' is greater than an area of a lower portion of the through hole 82'. An angle formed between a side wall of the through hole 82' and a thickness direction of the MEMS apparatus is within a range from 5° to 10°.

During a process for etching the sealing layer 8' and the lid oxide layer 5', if TiN is provided on a surface of the first bonding metal 41', a TiN removal and etching step may be further provided for removing TiN. If the etching step described above may last for a long enough time, the TiN removal and etching step may be omitted.

It can be seen that with this manner, the through hole that exposes the first bonding metal 41' can be formed by only one etching step. However, with this manner, the through hole 82' cannot have a large depth. For example, if the through hole is required to have a depth of at least 9 μm, this manner may not be practical.

Third Manner

In this manner, the first sacrificial layer 21', the MEMS device 3', the second sacrificial layer 22', the first bonding metal 41' and the lid oxide layer 5' are formed with still reference to FIG. 1.

After the lid oxide layer 5' is formed, same as the second manner, as shown in FIG. 2, and FIG. 8, the first mask 61' shown in FIG. 2 is set correspondingly to the first sacrificial layer 21' and the second sacrificial layer 22', and vent holes 51' penetrating the lid oxide layer 5' are formed by using the small openings of the first mask 61'. The vent holes 51' are used for etching the first sacrificial layer 21' and the second sacrificial layer 22' to form a cavity 7' at positions of the first sacrificial layer 21' and the second sacrificial layer 22' to release the MEMS device 3'.

With reference to FIG. 9, when the cavity 7' is formed after the first sacrificial layer 21' and the second sacrificial layer 22' are removed, a sealing layer 8' is formed on the lid oxide layer 5'. In an example, the sealing layer 8' may be made of oxide or nitride to seal the vent hole 51' of the lid oxide layer 5'.

Figure 12:
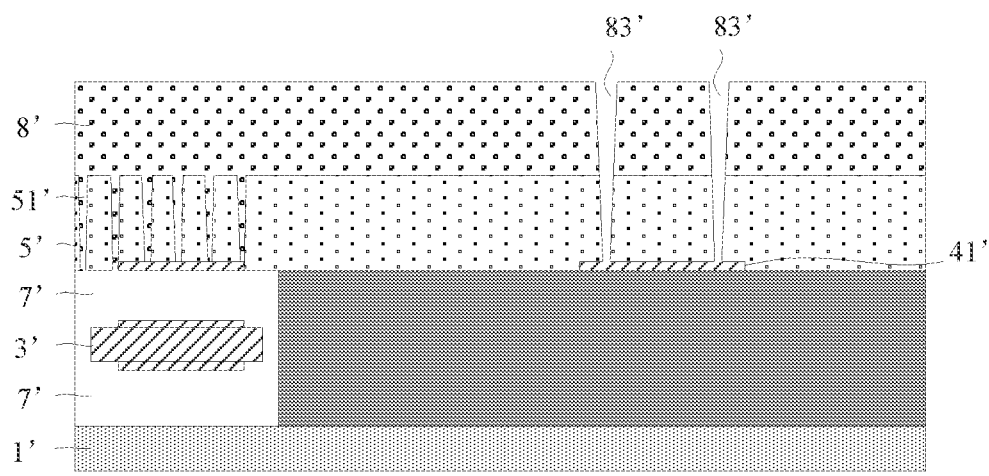
FIG. 12 is still another schematic cross-sectional view of a MEMS apparatus during a manufacturing process in the related art.

After the sealing layer 8' is formed, a fifth mask is used to pattern the sealing layer 8' and the lid oxide layer 5', so as to form a through hole 83' that penetrates the sealing layer 8' and the lid oxide layer 5' and exposes the first bonding metal 41', as shown in FIG. 12.

Figure 13:
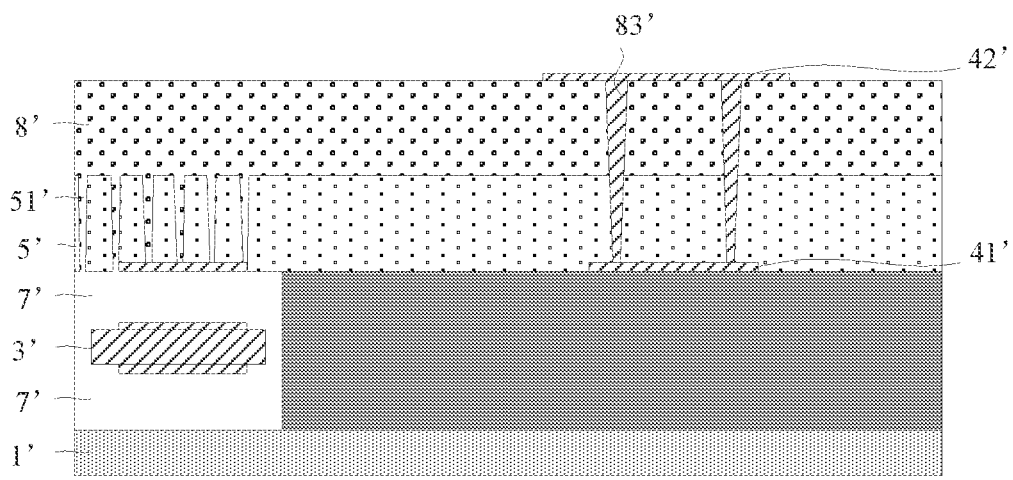
FIG. 13 is still another schematic cross-sectional view of a MEMS apparatus during a manufacturing process in the related art.

After the through hole 83' is formed, with reference to FIG. 13, a second bonding metal 42' is formed on a side of sealing layer 8' facing away from the base 1'. The second bonding metal 42' overlaps with the through hole 83' and is electrically connected to the first bonding metal 41' through the through hole 83'.

Figure 14:
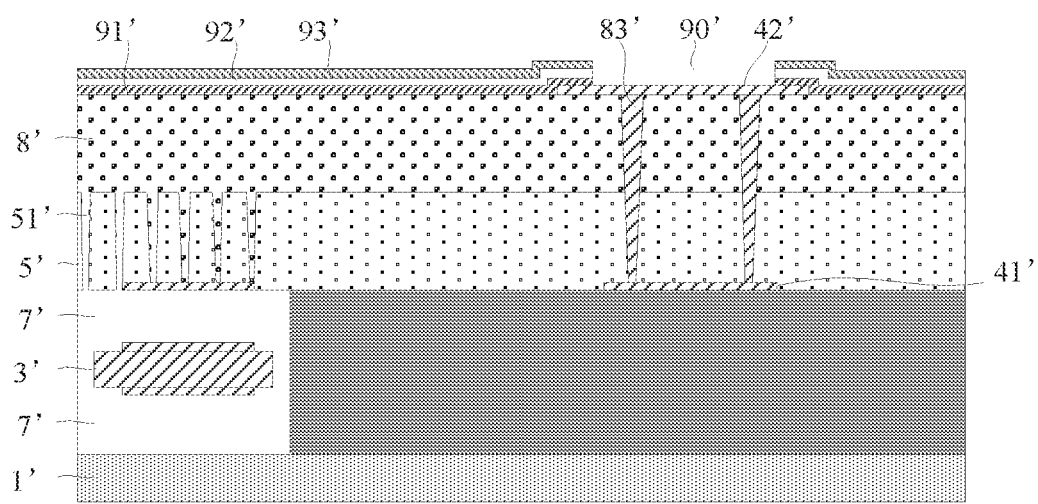
FIG. 14 is still another schematic cross-sectional view of a MEMS apparatus during a manufacturing process in the related art.

After the second bonding metal 42' is formed, with reference to FIG. 14, an oxide layer 91', a passivation layer 92' and a photosensitive polyimide (PSPI) layer 93' are sequentially formed on a side of the second bonding metal 42' facing away from the base 1'. Then, the oxide layer 91', the passivation layer 92' and the PSPI layer 93' are etched by using the fifth mask to form a through hole 90' that exposes the second bonding metal 42'. Then, RDL may be formed, so that the RDL is electrically connected to the second bonding metal 42' through the first bonding metal 41'. In this way, the MEMS apparatus is connected to an external circuit to drive the MEMS device and transmit a signal outputted from the MEMS device.

In an example, the PSPI may be left on the wafer for bump plating.

With this manner, if a vertical distance between the second bonding metal 42' and the first bonding metal 41' is approximately 9 μm, it will be difficult to form the through hole 83' having a width of approximately 1.25 μm.

Fourth Manner

Figure 15:
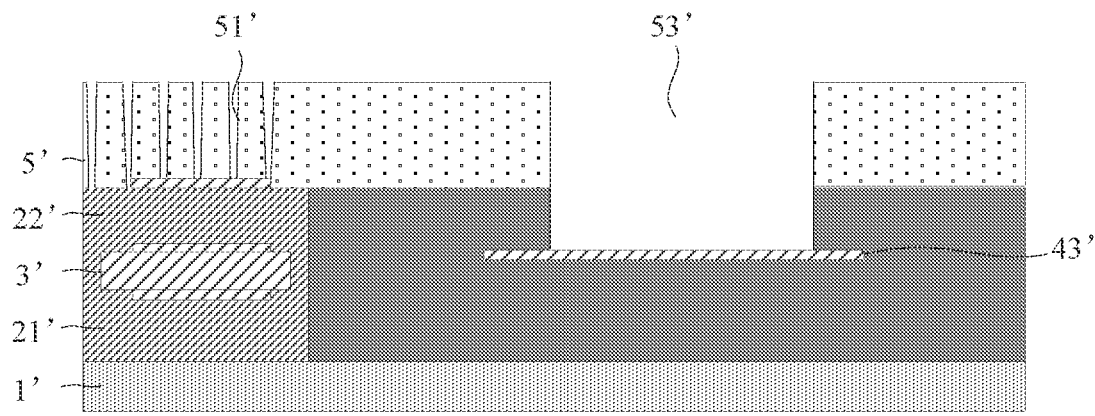
FIG. 15 is still another schematic cross-sectional view of a MEMS apparatus during a manufacturing process in the related art.

With reference to FIG. 15, first, a first sacrificial layer 21', a MEMS device 3' and a second sacrificial layer 22' are sequentially formed on a side of a base 1'. During this process, a third bonding metal 43' is formed at a position between the MEMS device 3' and the second sacrificial layer 22'. The third bonding metal 43' is formed by bypassing the first sacrificial layer 21' and the second sacrificial layer 22'. Then, a lid oxide layer 5' is formed on a side of the second sacrificial layer 22' facing away from the base 1'.

After the lid oxide layer 5' is formed, the lid oxide layer 5' is patterned. In a patterning process, masks having shapes as shown in FIG. 2 and FIG. 3 may be used. Here, a first mask 61' shown in FIG. 2 includes a plurality of small openings (as shown by the positions not filled with a black color in FIG. 2), and a second mask 62' shown in FIG. 3 includes a large opening 620'.

With further reference to FIG. 15, after the lid oxide layer 5' is formed, the first mask 61' shown in FIG. 2 is set correspondingly to the first sacrificial layer 21' and the second sacrificial layer 22', and the second mask 62' is set correspondingly to the first bonding metal 41'. Vent holes 51' penetrating through the lid oxide layer 5' are formed in the lid oxide layer 5' by using the small openings of the first mask 61'. The vent holes 51' are used for etching the first sacrificial layer 21' and the second sacrificial layer 22' to form a cavity 7' at original positions of the first sacrificial layer 21' and the second sacrificial layer 22' to release the MEMS device 3'. A through hole 53' penetrating the lid oxide layer 5' and exposing the third bonding metal 43' is formed in the lid oxide layer 5' by using the large opening of the second mask 62'.

Figure 16:
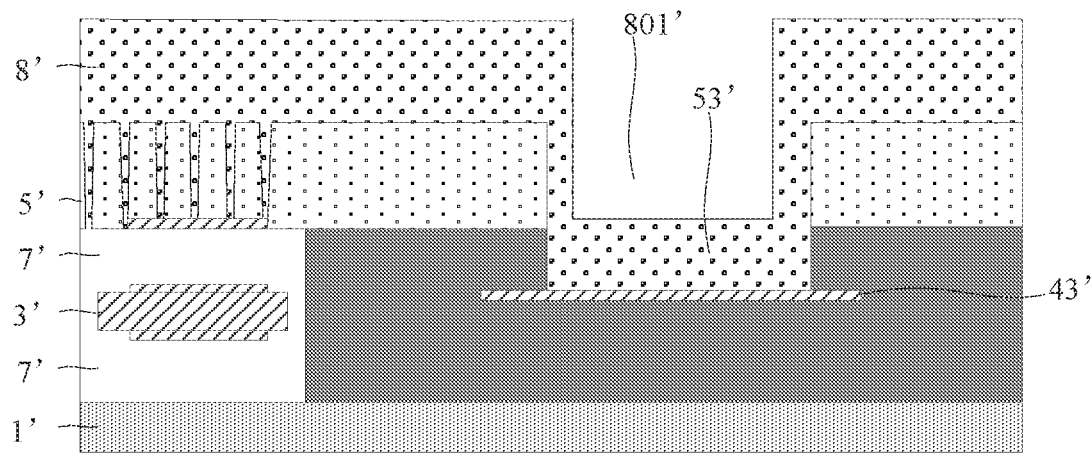
FIG. 16 is still another schematic cross-sectional view of a MEMS apparatus during a manufacturing process in the related art.

When the cavity 7' is formed after the first sacrificial layer 21' and the second sacrificial layer 22' are removed, a sealing layer 8' is formed on the lid oxide layer 5', as shown in FIG. 16. In an example, the sealing layer 8' may be made of oxide or nitride to seal the vent holes that are formed in the lid oxide layer 5'. With reference to FIG. 16, after the sealing layer 8' is formed, the through hole 53' is filled. In an example, forming the sealing layer 8' may adopt a conformal process, that is, after the sealing layer 8' is formed, a surface of the sealing layer 8' will be formed into a shape similar to a surface of the lid oxide layer 5'. With reference to FIG. 16, the sealing layer 8' includes a concave structure 801' at a position corresponding to the through hole 52'.

Figure 17:
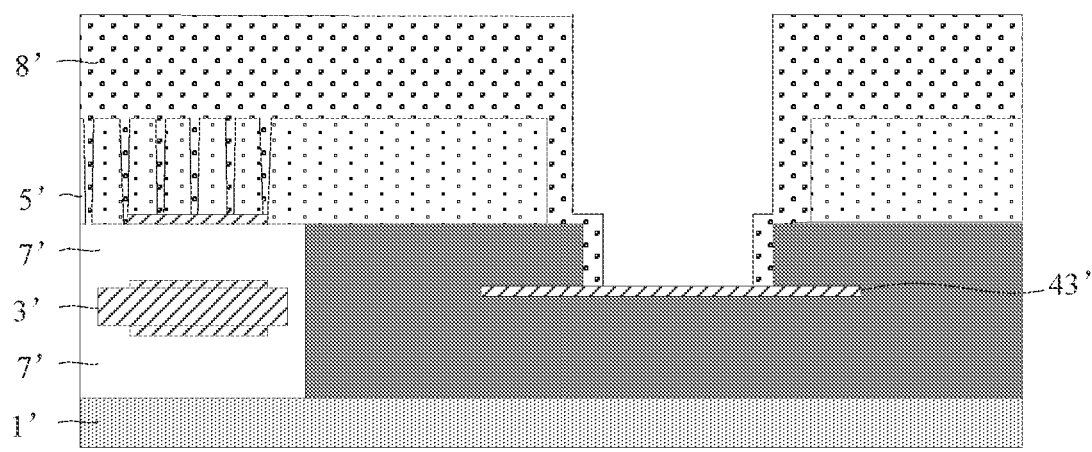
FIG. 17 is still another schematic cross-sectional view of a MEMS apparatus during a manufacturing process in the related art.

After the sealing layer 8' is formed, a sixth mask is used to pattern the sealing layer 8' to form a step-shaped through hole in the MEMS apparatus as shown in FIG. 17, which exposes the third bonding metal 43'. In this process, if TiN is provided on a surface of the third bonding metal 43', a TiN removal and etching step may be further provided for removing TiN. If the etching step described above may last for a long enough time, the TiN removal and etching step may be omitted. However, this method also has risks.

Figure 18:
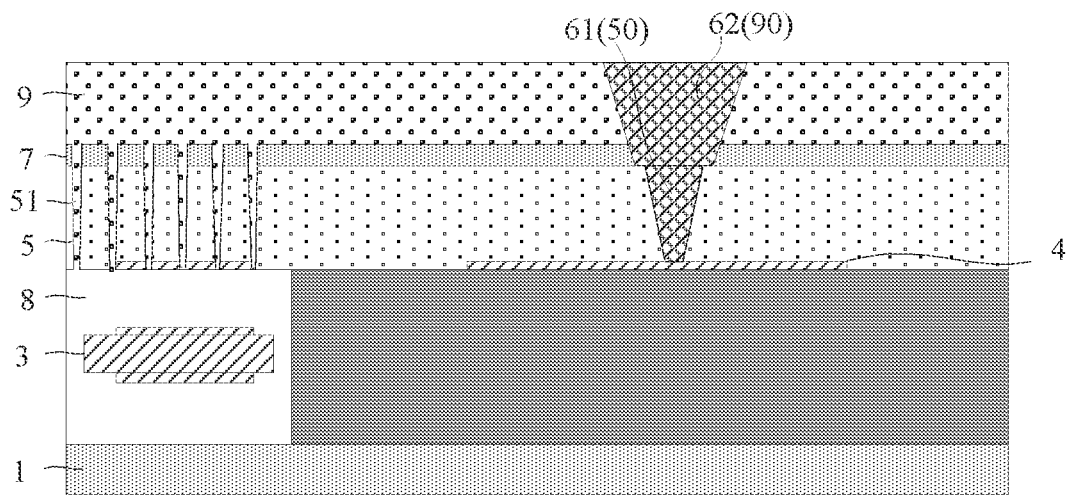
FIG. 18 is a schematic cross-sectional view of a MEMS apparatus according to an embodiment of the present invention.

In view of this, embodiments of the present invention provide an electrical interconnection structure and an electronic apparatus. FIG. 18 is a schematic cross-sectional view of a MEMS apparatus including an electrical interconnection structure according to an embodiment of the present invention. With reference to FIG. 18, the MEMS apparatus includes a base 1, a cavity 8 located at a side of the base 1, and a MEMS device 3 arranged inside the cavity 8.

The electrical interconnection structure includes a bonding metal 4, a first dielectric layer 5, and a second dielectric layer. The second dielectric layer includes a first dielectric sub-layer 7 and a second dielectric sub-layer 9. The bonding metal 4 is located on a side of the cavity 8 facing away from the base, and the first dielectric layer 5 is located on a side of the bonding metal 4 facing away from the base 1. The first dielectric layer 5 includes a first through hole 50 penetrating the first dielectric layer 5 and exposing the bonding metal 4. The first through hole 50 is filled with a first conductive material 61 electrically connected to the bonding metal 4.

The first dielectric sub-layer 7 is located on a side of the first dielectric layer 5 facing away from the MEMS device 3. Vent holes 51 penetrating both the first dielectric sub-layer 7 and the first dielectric layer 5 are provided. An orthographic projection of etchant in the vent holes 51 onto the base 1 does not overlap an orthographic projection of the first conductive material filed in the first through hole 50 onto the base 1. In a process of manufacturing the MEMS apparatus, the vent holes 51 can be used to etch a sacrificial material to form the cavity 8 at an original position of the sacrificial material, so as to release the MEMS device 3. In an example, any one of $XeF_2$, $SF_6$, fluorocarbon, ashing oxygen, a mixture of HF and $CH_3OH$ can be used as an etchant to etch the sacrificial material. The etchant can be selected based on a material of the sacrificial layer. For example, when the sacrificial layer is a polymer, an oxygen or ozone ashing method can be used.

The second dielectric sub-layer 9 is located on a side of the first dielectric sub-layer 7 facing away from the first dielectric layer 5, and the second dielectric sub-layer 9 is used to fill the above-mentioned vent holes 51 to seal the vent holes 51. A second through hole 90 penetrating both the second dielectric sub-layer 9 and the first dielectric sub-layer 7 is provided. An area of the second through hole 90 is greater than an area of the first through hole 50. That is, an orthographic projection of the second conductive material filed in the second through hole 90 onto the base 1 covers the orthographic projection of the first conductive material filed in the first through hole 50 onto the base 1. The second through hole 90 is filled with a second conductive material 62 electrically connected to the first conductive material 61. In an example, an oxidized material may be selected to form the first dielectric layer 5 and the first dielectric sub-layer 7.

After the second conductive material 62 is formed, a redistribution layer may be formed on the second conductive material 62, so that the MEMS device is connected to an external circuit.

Figure 19:
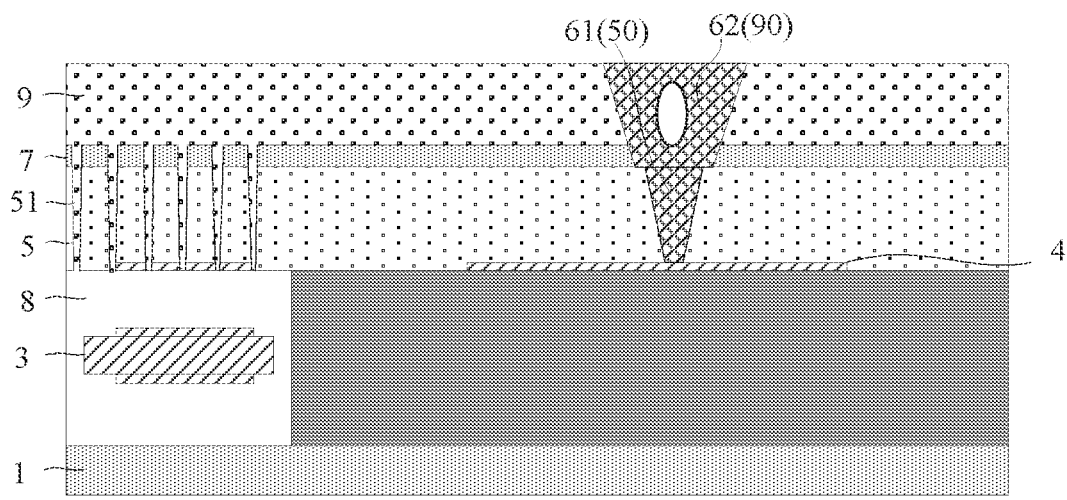
FIG. 19 is a schematic cross-sectional view of another MEMS apparatus according to an embodiment of the present invention.
Figure 20:
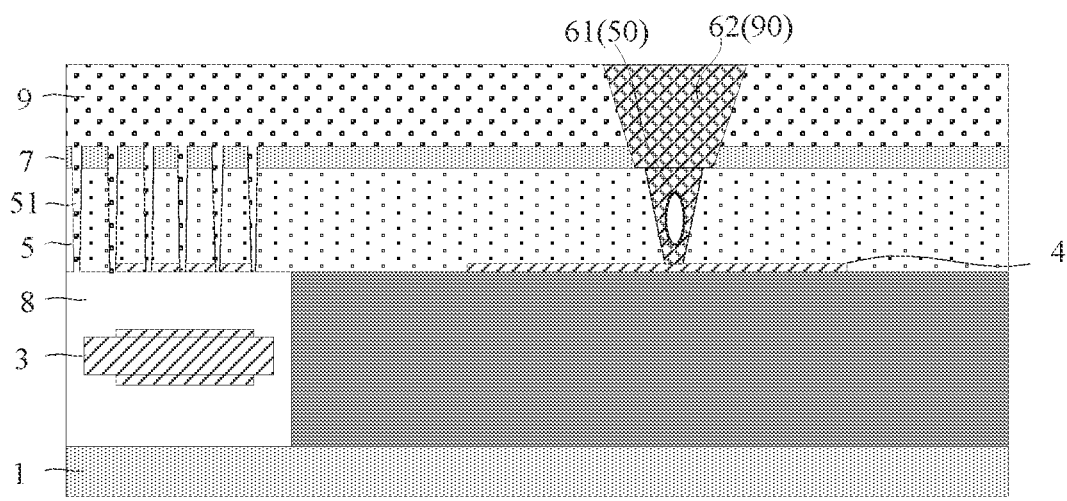
FIG. 20 is a schematic cross-sectional view of still another MEMS apparatus according to an embodiment of the present invention.

For the electrical interconnection structure and the MEMS apparatus provided by the embodiments of the present invention, the first through hole 50 and the second through hole 90 are stacked, and a total height of the first through hole 50 and the second through hole 90 can be adjusted by adjusting respective heights of the first through hole 50 and the second through hole 90, so that the total height of the two through holes can meet a certain requirement in terms of height. For example, the total height of the two may be set to be at least 9 μm, thereby increasing a ratio of a metal area to a thickness of a pull-up electrode. Moreover, on basis of increasing the height of the through holes, the through holes can be filled according to the embodiments of the present invention. When filling the first through hole 50 and/or the second through hole 90, the first conductive material 61 and/or the second conductive material 62, with which the first through hole 50 and/or second through hole 90 are filled based on the ratio of the height to the width of the first through hole 50 and/or second through hole 90, can achieve filling with no gap as shown in FIG. 18 or filling with a gap as shown in FIG. 19 and FIG. 20. When a gap is formed in the first conductive material and/or the second conductive material, the gap is buried inside the first conductive material and/or the second conductive material, thereby avoiding affecting an electrical interconnection between the electrical interconnection structure and an external redistribution layer. With such configuration, local accumulation of materials, including the first conductive material and the second conductive material, inside the through holes can be avoided. Moreover, with such configuration, the first conductive material 61 and the bonding metal 4 disposed at a lower position can be protected from being etched. In addition, a plurality of first through holes and a plurality of second through holes can be provided. That is, a density of through holes, including the first through hole and the second through hole, can be changed. This can achieve a higher RF performance for the MEMS apparatus, while increasing a yield of the MEMS apparatus.

In an example, each of the first through hole 50 and the second through hole 90 may be a taper-shaped through hole. That is, an angle may be formed between a side wall of the first through hole 50 and a thickness direction of the MEMS device and between a side wall of the second through hole 90 and the thickness direction of the MEMS device, respectively. For example, the angle may be within a range from 0° to 20°. This angle can be within a range of a conformal shape, and can be subsequently filled with a conductive material. As another example, a side wall of the first through hole 50 and a side wall of the second through hole 90 can be set to be perpendicular to the base.

In an example, the first conductive material 61 described above includes tungsten or copper.

In an example, when a material including tungsten is selected as the first conductive material 61, it can be manufactured by a chemical vapor deposited (CVD) tungsten hexafluoride $WF_6$ method. After the deposition is completed, a W-polishing (CPW) method may be used to planarize its surface, which facilitates subsequent formation of the second conductive material 62 and improves a contact performance of the first conductive material 61 and the second conductive material 62.

In an example, the orthographic projection of the first conductive material filed in the first through hole 50 and the orthographic projection of the second conductive material filed in the second through hole 90 onto the base 1 may each have a circular shape or a polygonal shape, which will not be limited in the embodiments of the present invention. For example, when etching is performed to form the first through hole 50 and the second through hole 90, a mask having a hexagonal opening whose shape is close to a circular shape may be used. The orthographic projection of the first conductive material filed in the first through hole 50 and the orthographic projection of the second conductive material filed in the second through hole 90 onto the base 1 each have a hexagonal shape, thereby minimizing the conductive material filled therein.

In an example, a ratio of a height of the first through hole 50 to a width of the through hole 50 can be adjusted according to different application scenarios. For example, the ratio of the height of the first through hole 50 to the width of the through hole 50 can be set to be 3:1 or 4:1, so as to completely fill the first through hole with the conductive material, thereby avoiding a gap in the first conductive material due to the too large ratio of the height to the width of the first through hole 50. Here, the height of the first through hole 50 is equal to a thickness of the first dielectric layer 5. In an example, the thickness of the first dielectric layer 5 can be adjusted according to different application scenarios. In an example, the thickness of the first dielectric layer 5 may be within a range from 3 μm to 5 μm, e.g., the height of the first dielectric layer 5 may be 3.5 μm.

In an example, during a release etching process for the sacrificial layer, the thickness of the first dielectric sub-layer 7 can be adjusted to compensate for an etching rate required in the release etching process. For example, a thickness of the first dielectric sub-layer 7 is within a range from 0.2 μm to 0.3 μm. The first dielectric sub-layer 7 can protect tungsten from the etchant such as the $XeF_2$ in an etching step. Moreover, if there is a loss of the first dielectric layer 5 during the W-polishing (CPW) process, the first dielectric sub-layer 7 can also compensate for the loss of the first dielectric layer 5.

In an example, the thickness of the second dielectric sub-layer 9 can be set based on mechanical integrity and strength required by the electronic apparatus. For example, the thickness of the second dielectric sub-layer 9 may be 5.5 μm.

In an example, a sum of the height of the first through hole and the height of the second through hole may be adjusted according to different applications of the electronic apparatus. For example, the sum of the height of the first through hole and the height of the second through hole may be greater than or equal to 9 μm.

When manufacturing the MEMS apparatus shown in FIG. 18, in conjunction with FIG. 21 to FIG. 27, embodiments of the present invention provide manufacturing methods for the electrical interconnection structure and the electronic apparatus. The manufacturing methods will be described as follows.

Figure 21:
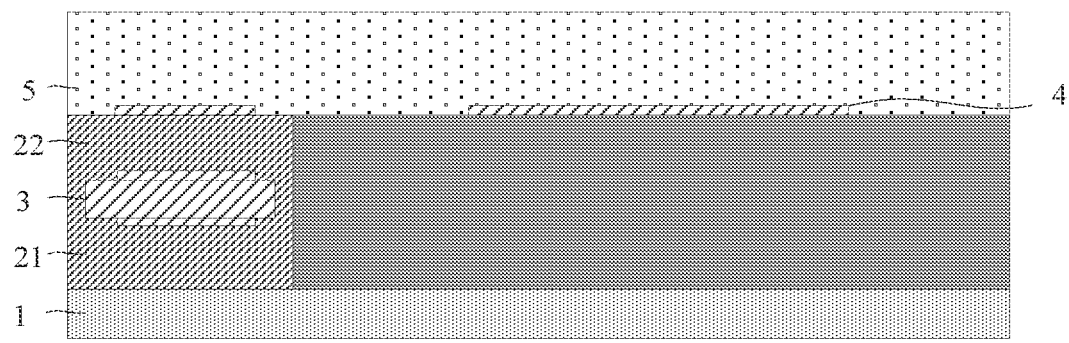
FIG. 21 is a schematic cross-sectional view of a MEMS apparatus during a manufacturing process according to an embodiment of the present invention.

At step S1, as shown in FIG. 21, first, a sacrificial layer and an electronic device are formed on a side of the base 1. In an example, a plurality of sacrificial layers may be provided. The electronic device may be a MEMS device. In an example, as shown in FIG. 19, a first sacrificial layer 21, a MEMS device 3, and a second sacrificial layer 22 are sequentially formed on a side of the base 1. Then, a bonding metal 4 is formed on a side of the second sacrificial layer 22 facing away from the first sacrificial layer 21. Then, a first dielectric layer 5 is formed on a side of the bonding metal 4 facing away from the second sacrificial layer 22. Here, materials of the first sacrificial layer 21 and the second sacrificial layer 22 may be selected from amorphous silicon (aSi), amorphous germanium (aGe), or polymers such as PVDF, PET and the like.

Figure 22:
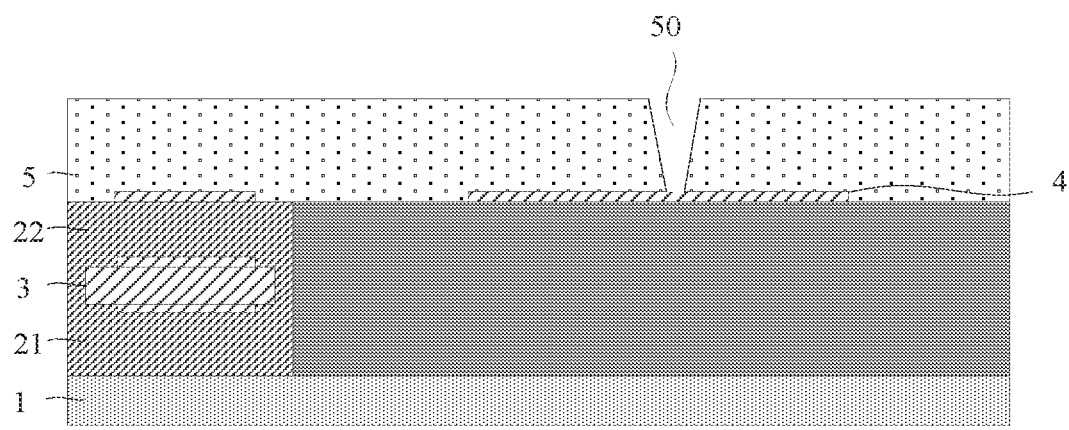
FIG. 22 is another schematic cross-sectional view of a MEMS apparatus during a manufacturing process according to an embodiment of the present invention.

At step S2, after the first dielectric layer 5 is formed, the first dielectric layer 5 is patterned. As shown in FIG. 22, a first through hole 50 penetrating the first dielectric layer 5 is formed in the first dielectric layer 5, and the first through hole 50 exposes the bonding metal 4. In an example, the first through hole 50 may be formed by etching.

Figure 23:
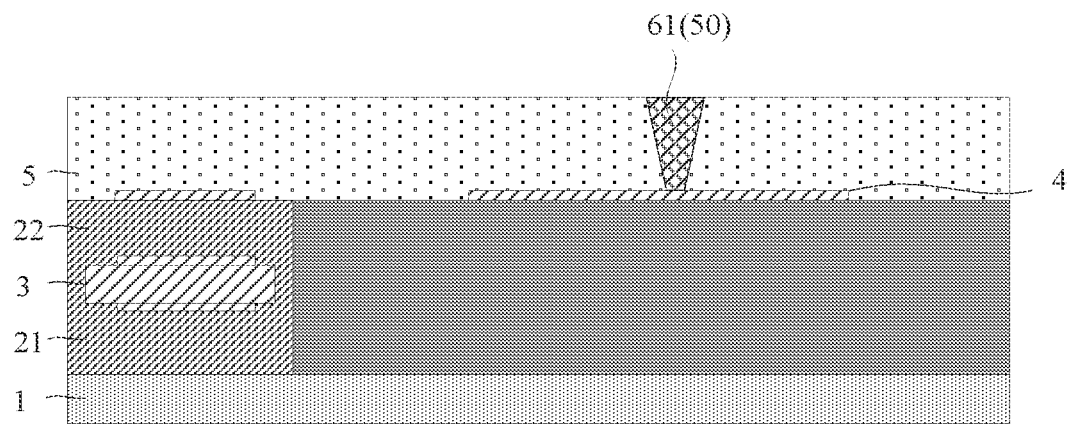
FIG. 23 is still another schematic cross-sectional view of a MEMS apparatus during a manufacturing process according to an embodiment of the present invention.

At step S3, as shown in FIG. 23, a first conductive material 61, with which the first through hole 50 is filled, is formed. In an example, CVD may be used to form WF6, with which the first through hole 50 is filled.

Figure 24:
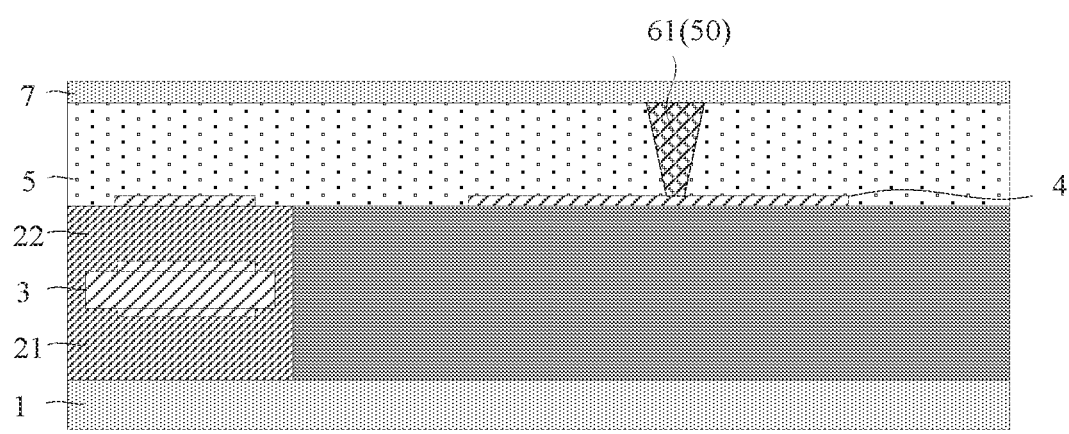
FIG. 24 is still another schematic cross-sectional view of a MEMS apparatus during a manufacturing process according to an embodiment of the present invention.

At step S4, as shown in FIG. 24, a first dielectric sub-layer 7 is formed on a side of the first dielectric layer 5 facing away from the MEMS device 3. In an example, a thickness of the first dielectric sub-layer 7 may be within a range from 0.2 μm to 0.3 μm.

Figure 25:
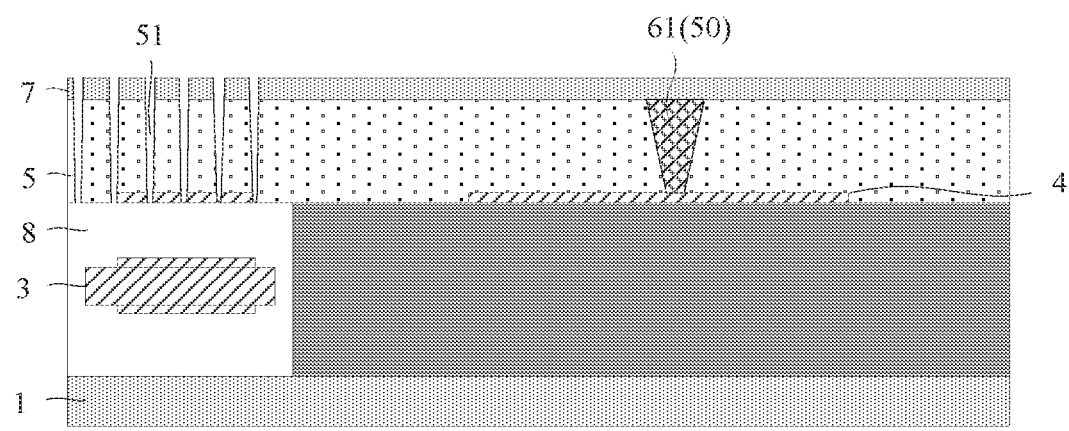
FIG. 25 is still another schematic cross-sectional view of a MEMS apparatus during a manufacturing process according to an embodiment of the present invention.

At step S5, as shown in FIG. 25, vent holes 51 penetrating the first dielectric sub-layer 7 and the first dielectric layer 5 are formed. An orthographic projection of etchant in the vent holes 51 onto the base 1 does not overlap an orthographic projection of the first conductive material filed in the first through hole 50 onto the base 1. After the vent holes 51 are formed, the first sacrificial layer 21 and the second sacrificial layer 22 are removed through the vent holes 51 to form a cavity 8 surrounding the MEMS device 3. In an example, any one of $XeF_2$, ashing oxygen, $SF_6$, fluorocarbon, or a mixture of HF and $CH_3OH$ can be used as an etchant. The etchant can be selected based on a material of the sacrificial layer. For example, when the sacrificial layer is a polymer, an oxygen or ozone ashing method can be used. If the material of the first sacrificial layer 21 is different from that of the second sacrificial layer 22, a sequential or mixed release process may be adopted. For example, chemical, physical, and vapor-based isotropic etching chemicals may be used for etching.

Figure 26:
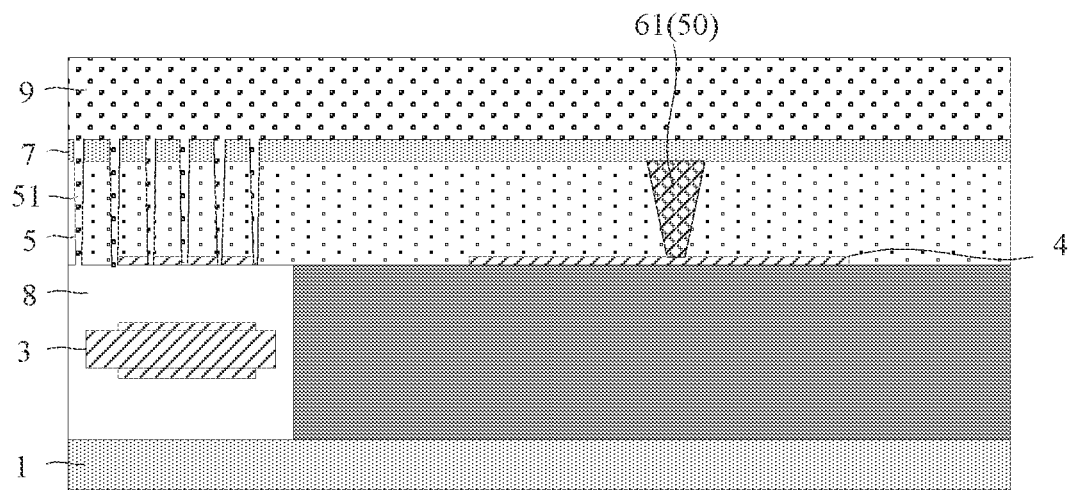
FIG. 26 is still another schematic cross-sectional view of a MEMS apparatus during a manufacturing process according to an embodiment of the present invention.

At step 6, as shown in FIG. 26, after the cavity 8 is formed, a second dielectric sub-layer 9 is formed on a side of the first dielectric sub-layer 7 facing away from the base 1. The vent hole 51 described above are filled with the second dielectric sub-layer 9. In an example, a thickness of the second dielectric sub-layer 9 may be 5.5 μm.

Figure 27:
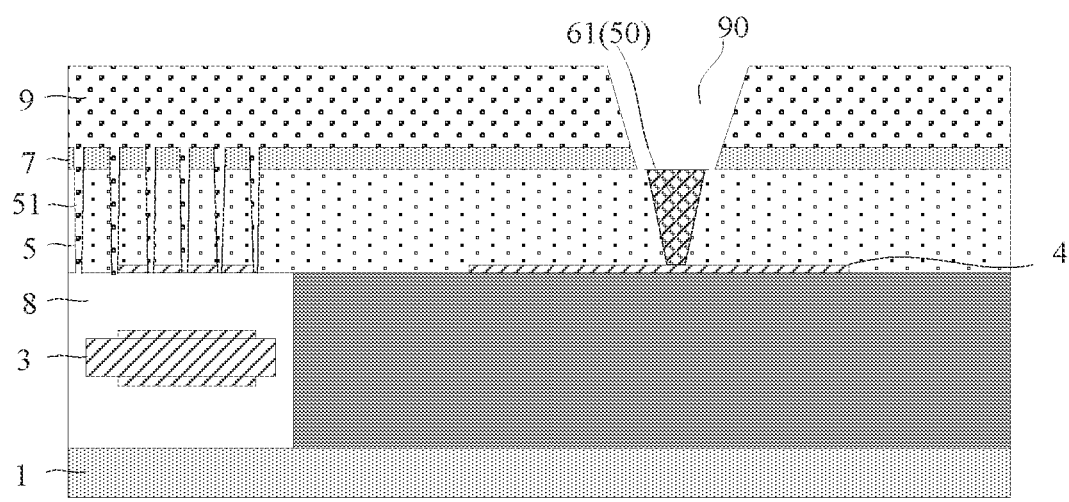
FIG. 27 is still another schematic cross-sectional view of a MEMS apparatus during a manufacturing process according to an embodiment of the present invention.

At step 7, as shown in FIG. 27, a second through hole 90 penetrating both the second dielectric sub-layer 9 and the first dielectric sub-layer 7 is formed. An area of the second through hole 90 is greater than an area of the first through hole 50. That is, an orthographic projection of the second conductive material filed in the second through hole 90 onto the base 1 covers the orthographic projection of the first conductive material filed in the first through hole 50 onto the base 1.

At step S8, as shown in FIG. 18, a second conductive material 62, with which the second through hole 90 is filled, is formed, and the second conductive material 62 is electrically connected to the first conductive material 61.

After the second conductive material 62 is formed, a redistribution layer may be formed on the second conductive material 62, so that the MEMS device is connected to an external circuit.

With the manufacturing method for the MEMS apparatus according to the embodiments of the present invention, the first through hole 50 and the second through hole 90 that are stacked are provided, and a height of the first through hole 50 and a height of the second through hole 90 can be adjusted to achieve adjustment of a total height of the through holes, in such a manner that the total height of the through holes satisfies a certain height requirement. For example, the total height of the two through holes can be at least 9 μm, thereby increasing a ratio of a metal area to a thickness of a pull-up electrode. Moreover, on basis of increasing the height of the through holes, the through holes can be filled according to the embodiments of the present invention. When filling the first through hole 50 and/or second through hole 90, the first conductive material 61 and/or the second conductive material 62, with which the first through hole 50 and/or the second through hole 90 are filled based on the ratio of the height to the width of the first through hole 50 and/or the second through hole 90, can achieve filling with no gap as shown in FIG. 18 or filling with a gap as shown in FIG. 19 and FIG. 20. When a gap is formed in the first conductive material and/or the second conductive material, the gap is buried inside the first conductive material and/or the second conductive material, thereby avoiding affecting an electrical interconnection between the electrical interconnection structure and an external redistribution layer. With such configuration, local accumulation of materials, including the first conductive material and the second conductive material, inside the through holes can be avoided. Moreover, with such configuration, the first conductive material 61 and the bonding metal 4 disposed at a lower position can be protected from being etched. In addition, with such configuration, a plurality of first through holes and a plurality of second through holes can be provided. That is, a density of through holes, including the first through hole and the second through hole, can be changed. This can achieve a higher RF performance for the MEMS apparatus, while increasing a yield of the MEMS apparatus.

In an example, the MEMS device 3 may be a capacitor.

In an example, in the embodiments of the present invention, the MEMS device 3 may be a motion sensor (such as a gyroscope or an accelerometer), an RF MEMS device (such as an RF switch, a resonator, or a filter), a MEMS magnetometer, or an optical MEMS device (such as a MEMS micro-mirror), a MEMS oscillator, a MEMS microphone, a piezoelectric device, a thermal phase switch, a magnetic MEMS and/or any other type of MEMS device, which will not be limited in the embodiments of the present invention.

The above-described embodiments are merely preferred embodiments of the present invention and are not intended to limit the present invention. Any modifications, equivalent substitutions and improvements made within the principle of the present invention shall fall into the protection scope of the present invention.

What is claimed is:

1. An electrical interconnection structure, used to provide electrical connections between electronic devices and external circuits, the electronic devices located inside an electronic apparatus and includes a Micro Electro Mechanical Systems (MEMS) device; the electronic apparatus further comprising a base, the MEMS device is located in a cavity at a side of the base; the electrical interconnection structure is located at a side of the cavity facing away from the base; an orthographic projection of the electrical interconnection structure to the base does not overlap with an orthographic projection of the MEMS device to the base; an orthographic projection of the electrical interconnection structure along a thickness direction perpendicular to the electronic apparatus does not overlap with an orthographic projection of the MEMS device along the thickness direction perpendicular to the electronic apparatus; the electronic apparatus also comprises a sacrificial layer deposited on the base, and the cavity is formed in the sacrificial layer; the electrical interconnection structure comprising:

a bonding metal located at a side of the sacrificial layer away from the base; an orthographic projection of the bonding metal to the base does not overlap with the cavity;

a first dielectric layer located at a side of the bonding metal, wherein the first dielectric layer comprises a first through hole penetrating the first dielectric layer, and the first through hole only penetrates the first dielectric layer; the first through hole exposes the bonding metal, and the first through hole is filled with a first conductive material electrically connected to the bonding metal; and a second dielectric layer located at a side of the first dielectric layer facing away from the bonding metal, wherein the second dielectric layer comprises a second through hole, the second dielectric layer comprises a first dielectric sub-layer and a second dielectric sub-layer that are stacked, and the first dielectric sub-layer is located between the second dielectric sub-layer and the first dielectric layer; the second through hole completely penetrates the first dielectric sub-layer and the second dielectric sub-layer; an orthographic projection of a second conductive material filed in the second through hole onto a plane of the bonding metal completely covers an orthographic projection of the first conductive material filed in the first through hole onto the plane of the bonding metal, and the second conductive material is electrically connected to the first conductive material; and a gap is formed in the first conductive material and/or the second conductive material.

2. The electrical interconnection structure as described in claim 1, wherein a sum of a height of the first through hole and a height of the second through hole is greater than or equal to 9 μm.

3. The electrical interconnection structure as described in claim 1, wherein each of the first through hole and the second through hole is a taper-shaped through hole, and an angle formed between a side wall of the taper-shaped through hole and a thickness direction of the electrical interconnection structure is within a range from 0° to 20°.

4. The electrical interconnection structure as described in claim 1, wherein the first conductive material comprises tungsten or copper.

5. The electrical interconnection structure as described in claim 1, wherein a ratio of a height of the first through hole to a width of the first through hole is within a range from 3:1 to 4:1.

6. The electrical interconnection structure as described in claim 1, wherein a thickness of the first dielectric layer is 3.5 μm.

7. The electrical interconnection structure as described in claim 1, wherein a thickness of the second dielectric layer is within a range from 5.7 μm to 5.8 μm.

8. The electrical interconnection structure as described in claim 7, a thickness of the first dielectric sub-layer is within a range from 0.2 μm to 0.3 μm.

9. The electrical interconnection structure as described in claim 8, wherein a thickness of the second dielectric sub-layer is 5.5 μm.

10. An electronic apparatus, comprising:
an electronic device; and
the electrical interconnection structure as described in claim 1,
wherein the electrical interconnection structure is electrically connected to the electronic device.

11. The electronic apparatus as described in claim 10, wherein
vent holes penetrating both the first dielectric layer and the first dielectric sub-layer are provided, and an orthographic projection of etchant in each of the vent holes onto a plane of the base does not overlap an orthographic projection of the first conductive material filed in the first through hole onto the plane of the base; and
the vent holes are filled with the second dielectric sub-layer.

* * * * *